(12) United States Patent
Muramoto

(10) Patent No.: US 11,152,531 B2
(45) Date of Patent: Oct. 19, 2021

(54) METHOD OF MANUFACTURING SEMICONDUCTOR DEVICE

(71) Applicant: NICHIA CORPORATION, Anan (JP)

(72) Inventor: Eiji Muramoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/886,279

(22) Filed: May 28, 2020

(65) Prior Publication Data

US 2020/0381583 A1  Dec. 3, 2020

(30) Foreign Application Priority Data

May 30, 2019 (JP) .............................. JP2019-101490

(51) Int. Cl.
*H01L 33/00* (2010.01)

(52) U.S. Cl.
CPC .. *H01L 33/0093* (2020.05); *H01L 2933/0025* (2013.01); *H01L 2933/0066* (2013.01)

(58) Field of Classification Search
None
See application file for complete search history.

(56) References Cited

U.S. PATENT DOCUMENTS

| 8,941,119 B2* | 1/2015 | Miyachi | H01L 33/44 |
| | | | 257/76 |
| 2012/0305964 A1* | 12/2012 | Akaike | H01L 33/405 |
| | | | 257/98 |
| 2020/0105971 A1* | 4/2020 | Muramoto | H01L 33/22 |

FOREIGN PATENT DOCUMENTS

| JP | 2016-195187 A | 11/2016 |
| JP | 2017-005156 A | 1/2017 |
| JP | 2017-162907 A | 9/2017 |

* cited by examiner

*Primary Examiner* — Bradley Smith
(74) *Attorney, Agent, or Firm* — Foley & Lardner LLP

(57) ABSTRACT

A method of manufacturing a semiconductor device includes: providing a first member comprising: a first substrate, a semiconductor layer disposed on the first substrate and defining a first recess, and a first metal layer disposed above at least a portion other than the first recess, the first member defining a second recess in a region of a surface of the first member including a region directly above the first recess; providing a second member comprising: a second substrate, a second metal layer on or above the second substrate, a third metal layer on the second metal layer, and a fourth metal layer on the third metal layer; and bonding the first member and the second member together by heating the first metal layer and the fourth metal layer while facing each other. The third metal layer impedes interdiffusion between the second metal layer and the fourth metal layer.

19 Claims, 11 Drawing Sheets

METHOD OF MANUFACTURING SEMICONDUCTOR DEVICE

CROSS-REFERENCE TO RELATED APPLICATION

This application claims priority to Japanese Patent Application No. 2019-101490, filed on May 30, 2019, the entire contents of which are hereby incorporated by reference.

BACKGROUND

The present disclosure relates to a method of manufacturing a semiconductor device.

There is a known technique in which a semiconductor element formed on a growth substrate is bonded to a separately provided supporting substrate in order to transfer the semiconductor element to the supporting substrate (for example, Japanese Patent Publication No. 2017-5156 and Japanese Patent Publication No. 2017-162907 ("JP '907")).

For example, JP '907 describes a method of bonding a first member and a second member together, in which a third metal layer and a first metal layer are disposed in this order on a first substrate on which a semiconductor element has been formed, a fourth metal layer and a second metal layer are disposed in this order on a second substrate that is a supporting substrate provided separately, and heating is performed while the first metal layer and the second metal layer are in contact with each other. In JP '907, a metal with a melting point higher than that of the first metal layer is used for the third metal layer, and a metal with a melting point higher than that of the second metal layer is used for the fourth metal layer, and the first to fourth metal layers using such metals are alloyed together by heating at the time of bonding, so that the first to fourth metal layers can be firmly bonded together.

SUMMARY

However, when a semiconductor element defining a recess in a surface of the semiconductor element is transferred to the supporting substrate using an alloy layer in which a plurality of layers are alloyed as described in JP '907, the semiconductor element may be bonded to the supporting substrate with a gap left in the recess, which may lead to insufficient mechanical strength of the bonded portion.

Accordingly, one object of the present disclosure is to provide a manufacturing method that allows for reducing formation of a gap at the bonded portion even in the case in which a semiconductor layer having a recess in its surface is transferred to a supporting substrate.

A method of manufacturing a semiconductor device according to one embodiment of the present disclosure includes: providing a first member, the first member including: a first substrate, a semiconductor layer disposed on the first substrate and defining a first recess in a surface of the semiconductor layer, and a first metal layer disposed above at least a portion of the surface of the semiconductor layer other than the first recess, the first member defining a second recess in a region of a surface of the first member including a region directly above the first recess; providing a second member, the second member including: a second substrate, a third metal layer on or above the second substrate, a third metal layer on the second metal layer, and a fourth metal layer on the third metal layer; and bonding the first member and the second member together by heating the first metal layer and the fourth metal layer facing each other to allow the first and fourth metal layers to be interdiffused with the second metal layer and to be alloyed. The third metal layer impedes interdiffusion between the second metal layer and the fourth metal layer.

A method of manufacturing a semiconductor device according to another embodiment of the present disclosure includes: providing a first member the first member including: a first substrate, a semiconductor layer disposed on the first substrate and defining a first recess in a surface of the semiconductor layer, a fifth metal layer on or above the semiconductor layer, a sixth metal layer on the fifth metal layer, and a first metal layer on or above at least a portion of a surface of the sixth metal layer other than the first recess, the first member defining a second recess in a region of a surface of the first member including a region directly above the first recess; providing a second member including: a second substrate, and a fourth metal layer on or above the second substrate; and bonding the first member and the second member together by heating the first metal layer and the fourth metal layer facing each other to allow the first and fourth metal layers to be interdiffused with the fifth metal layer and to be alloyed. The sixth metal layer impedes interdiffusion of the fifth metal layer and the first and fourth metal layers.

According to certain embodiments of the manufacturing methods described in the present disclosure, even when the first recess is defined at a surface of the semiconductor layer disposed on the first substrate, the possibility that a gap will be left in the first recess at the bonded portion between the first substrate and the second substrate can be reduced.

DETAILED DESCRIPTION

Figure 1:
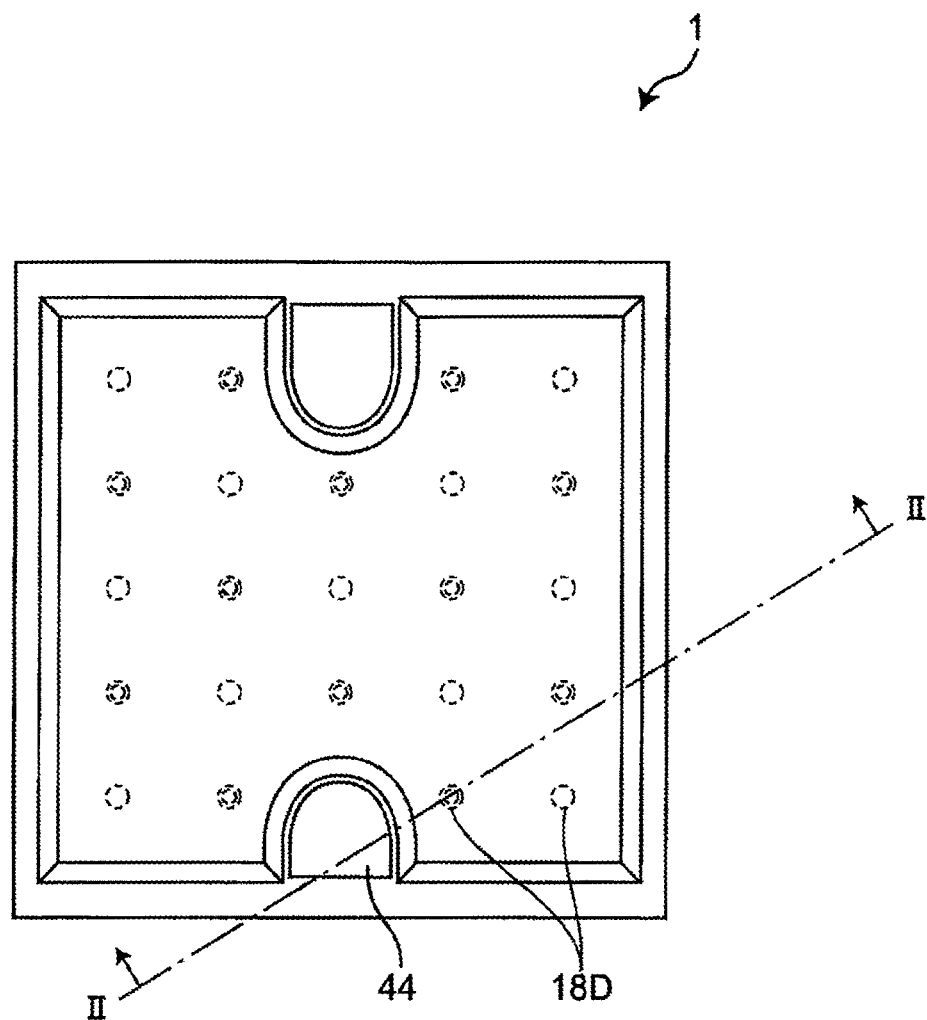
FIG. 1 is a schematic top view of a semiconductor device according to a first embodiment.

Certain embodiments of the present invention will be described in detail on the basis of drawings. The description below includes terms indicating directions or positions (such as "up", "down", "right", "left", and other terms containing these words) as appropriate. Use of these terms is intended to facilitate understanding of the invention with reference to the drawings, and the meanings of these terms do not limit the technical scope of the present invention to absolute directions. Portions or elements with the same reference numeral in a plurality of drawings represent the same portion or element.

The inventor of the present invention has studied bonding without forming a gap in the recess when transferring a semiconductor element defining the recess in a surface thereof to a supporting substrate using an alloy layer in which a plurality of metal layers are alloyed.

As a result, the inventor has found that the fluidity of metal is reduced in the alloying when the semiconductor element and the supporting substrate are bonded together, resulting in formation of a gap in the recess.

That is, in the case in which the semiconductor element is bonded to the supporting substrate using the alloy layer in which the plurality of metal layers are alloyed, a metal layer for alloy is required to be disposed under the outermost metal layer at the supporting substrate side or the semiconductor element side, in addition to the outermost metal layer at the semiconductor element side and the outermost metal layer at the supporting substrate side. However, the inventor has found that, in the bonding in this case, the outermost metal layer at the supporting substrate side or the semiconductor element side is alloyed with the metal layer for alloy, which causes reduction in the fluidity, so that a gap is left in the recess.

The method of manufacturing according to the present disclosure has been made on the basis of the above findings. In the method of manufacturing according to the present disclosure, a layer for impeding alloying is disposed between the outermost metal layer at the supporting substrate side or the semiconductor element side, so that deterioration in the fluidity of the outermost metal layer can be reduced in an early stage of bonding between the semiconductor element and the supporting substrate, which allows for reducing leaving of a gap in the recess.

More specifically, the present disclosure includes the modes described below, each of which allow for obtaining the effects described above.

In the description below, to facilitate the understanding of the relations with metal layers to be described below referring to embodiments, a plurality of layers to be alloyed by bonding are referred to as follows: (a) the outermost metal layer at the semiconductor element side is referred to as a "first metal layer"; (b) the outermost metal layer at the supporting substrate is referred to as a "fourth metal layer"; (c) a metal layer that is disposed between the supporting substrate and the fourth metal layer and is to be alloyed with the first metal layer and the fourth metal layer to form an alloy layer after bonding is referred to as a "second metal layer"; and (d) a metal layer that is disposed between the semiconductor element and the first metal layer and is to be alloyed with the first metal layer and the fourth metal layer to form the alloy layer after bonding is referred to as a "fifth metal layer." Note that, when referring to the metal layers, the terms "first," "second," "third," "fourth," "fifth," and "sixth," are merely used for identification purposes, and should not be interpreted to limit the metal layers to any particular numerical order in location or time unless expressly stated. Thus, for example, the claims may refer to "fourth" layers without first referring to "second" or "third" layers.

In a first mode, (1) the first metal layer is disposed at the bonding surface side of the semiconductor element, and (2) the fourth metal layer and the second metal layer, which is to be alloyed with the first metal layer and the fourth metal layer to form the alloy layer after bonding, are disposed at the bonding surface side of the supporting substrate, and the first metal layer is brought into contact with the fourth metal layer to bond the semiconductor element and the supporting substrate together.

In this first mode, a metal layer (a third metal layer in embodiments described below) for impeding alloying of the fourth metal layer and the second metal layer is disposed between the fourth metal layer disposed at the bonding surface side of the supporting substrate and the second metal layer disposed closer to the supporting substrate than the fourth metal layer is.

In a second mode, (1) the fourth metal layer is disposed at the bonding surface side of the supporting substrate and (2) the first metal layer and the fifth metal layer, which is to be alloyed with the first metal layer and the fourth metal layer to form the alloy layer after bonding, are disposed at the bonding surface side of the semiconductor element, and the first metal layer is brought into contact with the fourth metal layer to bond the semiconductor element and the supporting substrate together.

In this second mode, a metal layer (a sixth metal layer in the embodiments described below) for impeding alloying of the first metal layer and the fifth metal layer is disposed between the first metal layer disposed at the bonding surface side of the semiconductor element and the fifth metal layer disposed closer to the semiconductor element than the first metal layer is.

In a third mode, (1) the first metal layer and the fifth metal layer, which is to be alloyed with the first metal layer and the fourth metal layer to form the alloy layer after bonding, are disposed at the bonding surface side of the semiconductor element, and (2) the fourth metal layer and the second metal layer, which is to be alloyed with the first metal layer and the fourth metal layer to form the alloy layer after bonding, are disposed at the bonding surface side of the supporting substrate, and the first metal layer is brought into contact with the fourth metal layer to bond the semiconductor element and the supporting substrate together.

In this third mode, the metal layer (the third metal layer in the embodiments described below) for impeding alloying of the fourth metal layer and the second metal layer is disposed between the fourth metal layer formed at the bonding surface side of the supporting substrate and the second metal layer disposed closer to the supporting substrate than the fourth metal layer is, and the metal layer (the sixth metal layer in the embodiments described below) for impeding alloying of the first metal layer and the fifth metal layer is disposed between the first metal layer formed at the bonding surface side of the semiconductor element and the fifth metal layer disposed closer to the semiconductor element than the first metal layer is.

Certain embodiments of a semiconductor device according to the present disclosure and a method of manufacturing the same will be described below in detail.

First Embodiment

Figure 2:
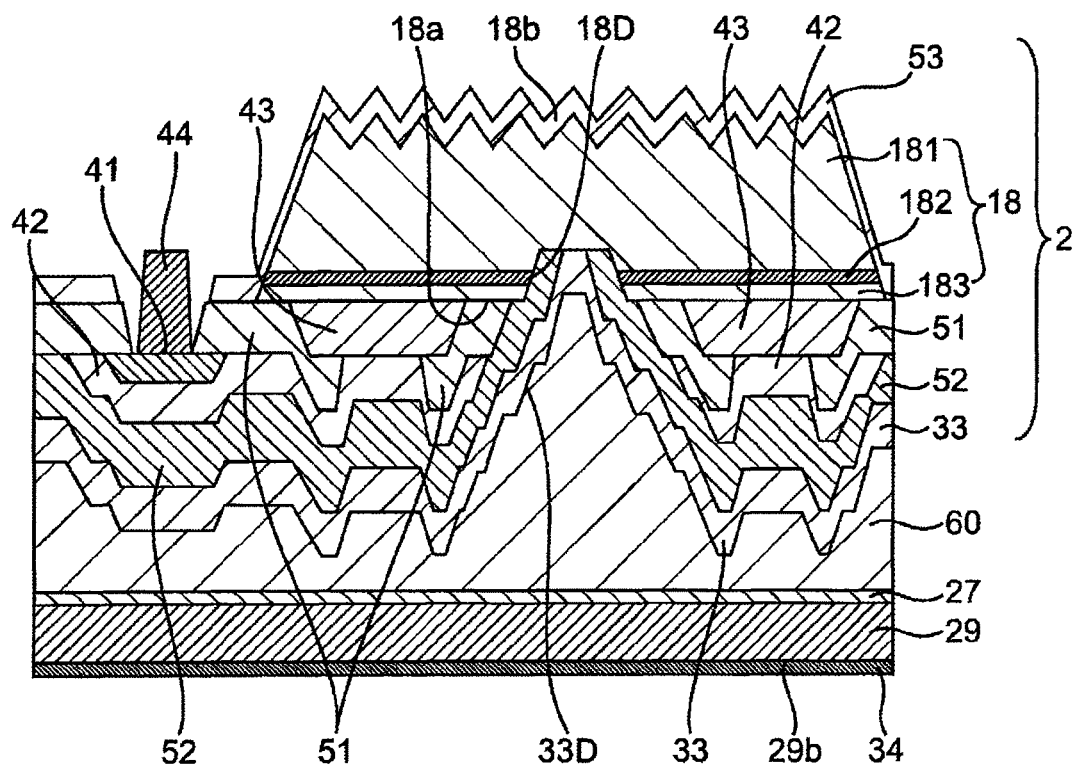
FIG. 2 is a schematic cross-sectional view taken along the line II-II of FIG. 1.

FIG. 1 is a schematic top view of a semiconductor device 1 according to a first embodiment. FIG. 2 is a schematic cross-sectional view taken along the line II-II of FIG. 1. The semiconductor device 1 shown in FIG. 1 and FIG. 2 is produced by bonding a semiconductor element structure 2 to a supporting substrate (also referred to as a "second substrate") 29 via an alloy bonding layer 60, in a method of manufacturing described below.

For example, the semiconductor element structure 2 includes a semiconductor layer 18 including a first conductivity-type semiconductor layer (such as an N-type semiconductor layer) 181, an active layer 182, and a second conductivity-type semiconductor layer (such as a P-type semiconductor layer) 183, a first electrode (such as an N-side electrode) 33 connected to the first conductivity-type semiconductor layer 181, and a second electrode (such as a P-side electrode) 43 connected to the second conductivity-type semiconductor layer 183. As shown in FIG. 2, the first electrode 33, the second electrode 43, and wiring electrodes for the first electrode 33 and the second electrode 43 are disposed between the semiconductor layer 18 and the alloy bonding layer 60. In this structure, the semiconductor element structure 2 defines a recess (a third recess 33D) in a surface of the semiconductor element structure 2 facing the supporting substrate 29 across the alloy bonding layer 60.

More specifically, as shown in FIG. 2, the second electrode 43 is disposed to be in ohmic contact with a surface of the second conductivity-type semiconductor layer 183 in a region other than a first recess 18D described below, extends from under the semiconductor layer 18 via second wiring 42, and is connected to first wiring 41 and a second pad electrode 44. A first protective film 51 is disposed between the second wiring 42 and the semiconductor layer 18. The semiconductor layer 18 defines the first recess 18D at the bottom of which the first conductivity-type semiconductor layer 181 is exposed. The first electrode 33 is disposed to be in ohmic contact with a surface of the first conductivity-type semiconductor layer 181 exposed at the bottom of the first recess 18D. An insulating second protective film 52 separates the first electrode 33 from the active layer 182, the second conductivity-type semiconductor layer 183, and the second wiring 42.

In the semiconductor device 1 having the structure described above, the third recess 33D is defined to have a depth greater than a depth of the first recess 18D and to have a bottom in the first recess 18D, which is formed to connect the first electrode 33 to the first conductivity-type semiconductor layer 181. When the semiconductor device 1 is produced using a method of manufacturing as described below, the third recess 33D is filled with the alloy bonding layer 60 as shown in FIG. 2, and formation of a gap is reduced.

In the semiconductor device 1, the supporting substrate 29 is electrically conductive, and a back surface 29b of the supporting substrate 29 is provided with a back electrode 34 that is electrically connected to the first electrode 33 via the alloy bonding layer 60, a seventh metal layer 27, and the supporting substrate 29.

The semiconductor device 1 having such a structure is produced by forming the semiconductor element structure 2 on a growth substrate and then transferring the semiconductor element structure 2 to the supporting substrate 29.

The method of manufacturing the semiconductor device 1 according to certain embodiments will be described in detail referring to FIGS. 3 to 10.

The method of manufacturing the semiconductor device 1 according to the first embodiment is a manufacturing method according to the third mode and includes at least providing a first member 10 including the semiconductor element structure 2, providing a second member 20 including the supporting substrate 29, and bonding the first member 10 and the second member 20 together.

These steps will be described below in detail.

Providing First Member 10

Figure 4A:
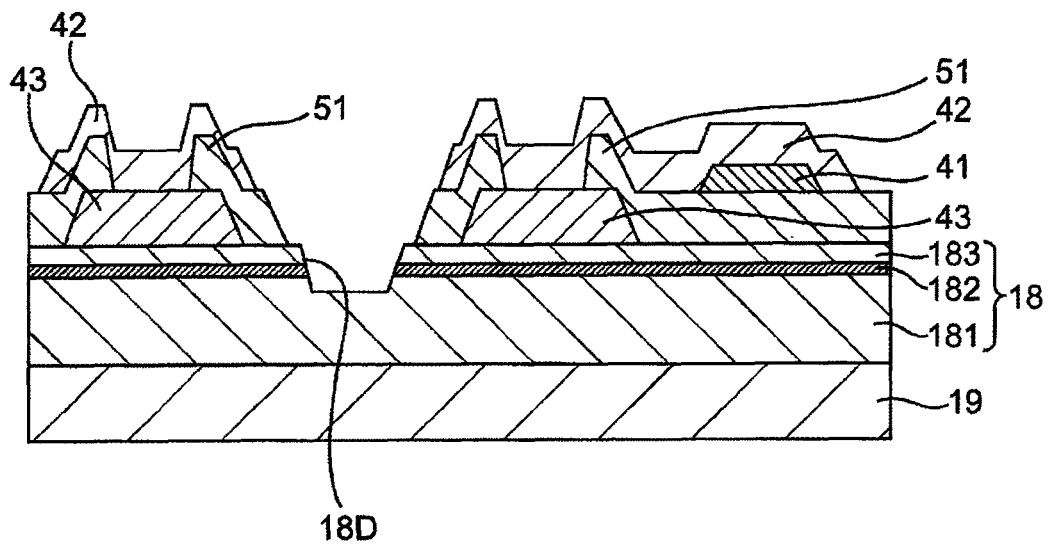
FIG. 4A and FIG. 4B are schematic cross-sectional views for illustrating the manufacturing steps of the semiconductor device according to the first embodiment.
Figure 4B:
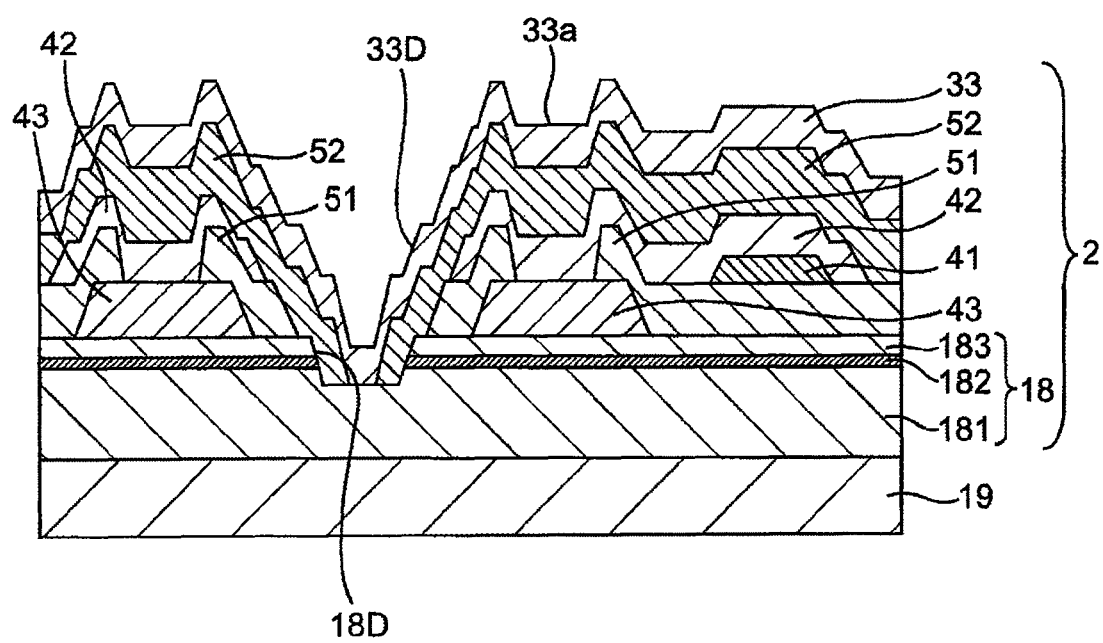
Figure 5:
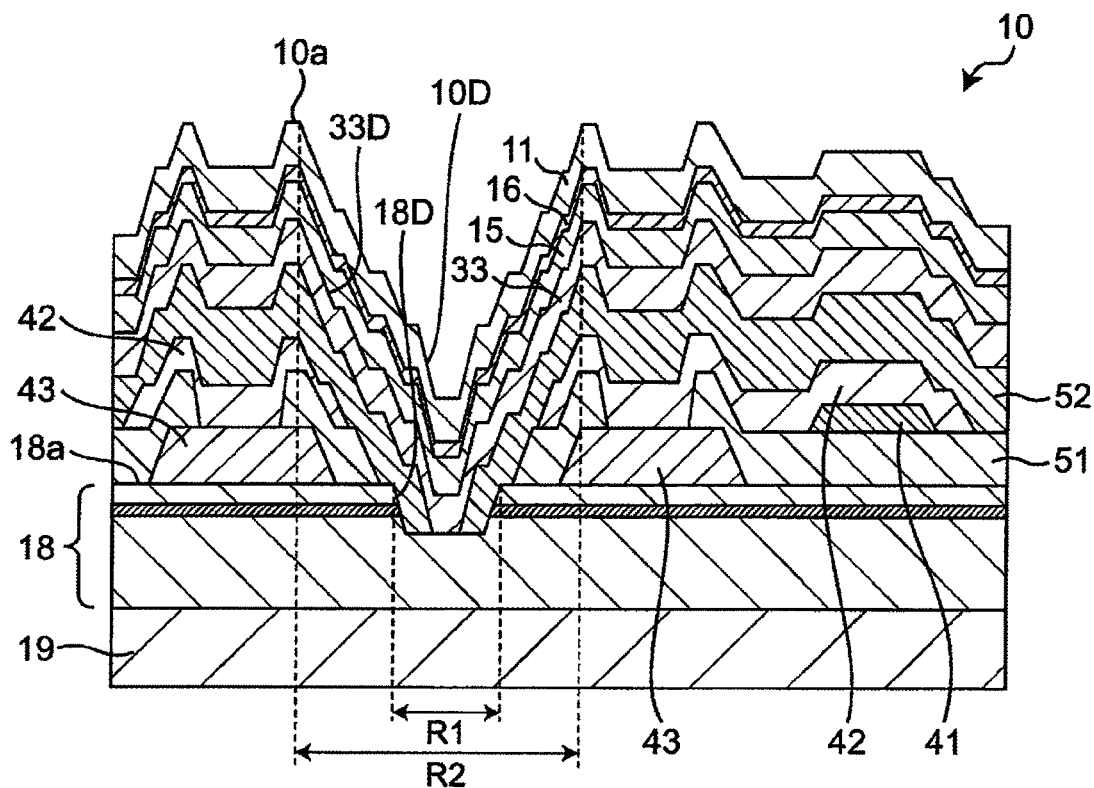
FIG. 5 is a schematic cross-sectional view for illustrating the manufacturing steps of the semiconductor device according to the first embodiment.

FIGS. 3 to 5 are schematic cross-sectional views for illustrating the step of providing a first member 10.

The first member 10 provided in the step of providing the first member 10 includes the semiconductor element structure 2 provided on the growth substrate (also referred to as a "first substrate") 19 and fifth, sixth, and first metal layers 15, 16, and 11 disposed over the semiconductor element structure 2 as shown in FIG. 5. The first member 10 is provided as follows.

Figure 3A:
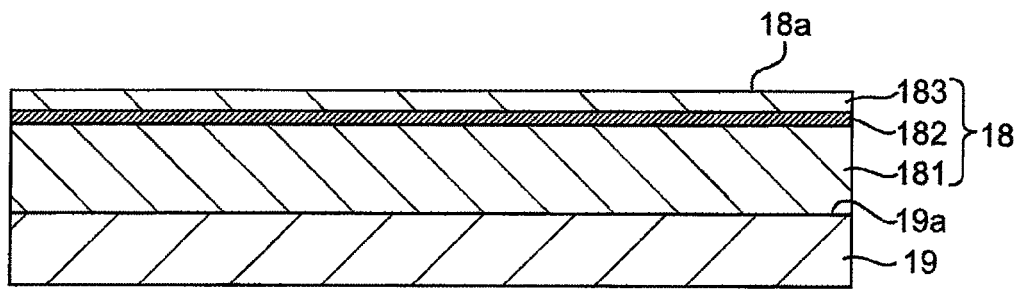
FIG. 3A to FIG. 3C are schematic cross-sectional views for illustrating manufacturing steps of the semiconductor device according to the first embodiment.

First, crystal growth of the first conductivity-type semiconductor layer 181, the active layer 182, and the second conductivity-type semiconductor layer 183 is performed in sequence on an upper surface 19a of the growth substrate 19 to form the semiconductor layer 18 as shown in FIG. 3A.

Figure 3B:
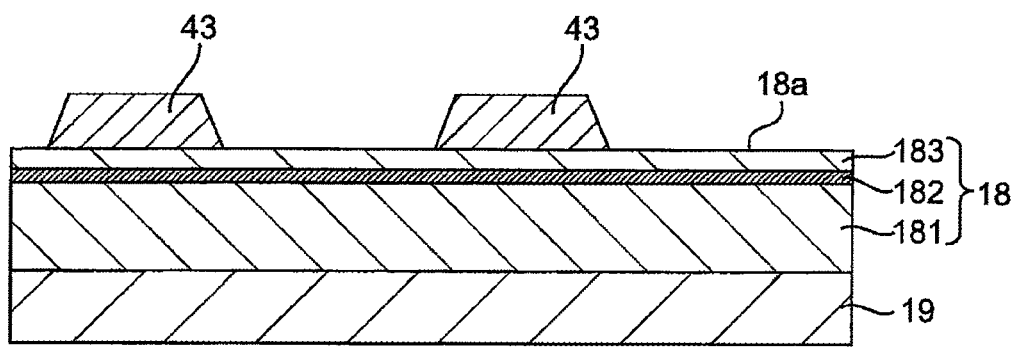

Next, the second electrodes 43 are formed on a surface 18a of the semiconductor layer 18 as shown in FIG. 3B. The second electrodes 43 can be formed by, for example, sputtering using a mask.

Figure 3C:
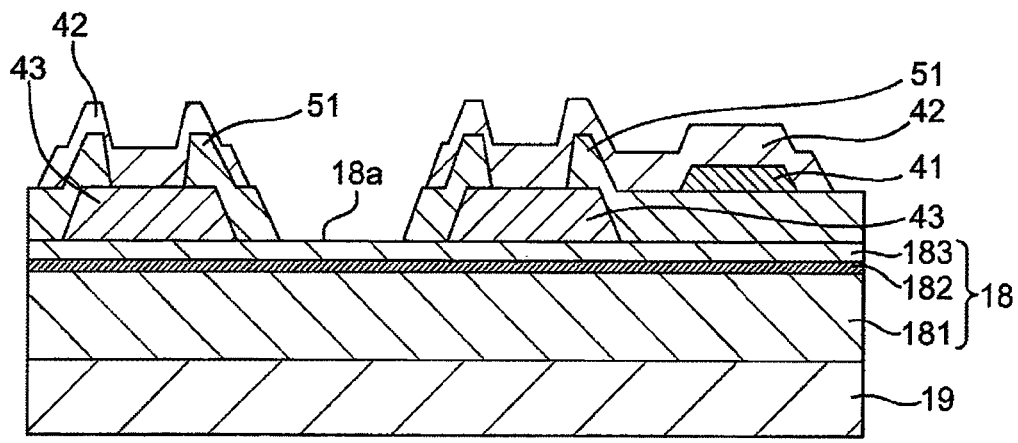

After that, the first protective film 51 is formed over the surface 18a of the semiconductor layer 18 and over the second electrodes as shown in FIG. 3C. At this time, the first protective film 51 is formed such that a portion of the surface 18a of the semiconductor layer 18 and a portion of the second electrodes 43 are exposed. The first wiring 41 is formed over the first protective film 51, and the second wiring 42 is formed to cover the first protective film 51, the first wiring 41, and the exposed portions of the second electrodes 43.

The first recess 18D is formed in the portion of the surface 18a of the semiconductor layer 18 exposed from the first protective film 51 (see FIG. 3C) as shown in FIG. 4A by, for example, reactive ion etching (RIE) using a mask. The first recess 18D is formed to have such a depth that the first conductivity-type semiconductor layer 181 is exposed at the bottom of the first recess 18D. The first recess 18D may have an appropriate shape. For example, the first recess 18D may have an inverted truncated circular cone shape.

The first recess 18D may be formed in the surface 18a of the semiconductor layer 18 before other members such as the second electrodes 43, the first protective film 51, the first wiring 41, and the second wiring 42 are formed.

After that, the first protective film 51, the first wiring 41, the second wiring 42, the second protective film 52, and the first electrode 33 are formed sequentially as shown in FIG. 4B. Members other than the second protective film 52 and the first electrode 33, that is, the first protective film 51, the first wiring 41, and the second wiring 42, are formed in a region other than the region above the first recess 18D. Accordingly, as shown in FIG. 4B, a recess (corresponding to the third recess 33D of the semiconductor device 1) having a depth greater than a depth of the first recess 18D is formed in a region of the upper surface (a surface 33a of the first electrode 33) of the semiconductor element structure 2 including the region directly above the first recess 18D. The depth of the first recess 18D indicates the difference between a height of the first conductivity-type semiconductor layer 181 exposed at the bottom of the first recess 18D and a height of the upper surface of the second conductivity-type semiconductor layer 183.

Next, the fifth metal layer 15, the sixth metal layer 16, and the first metal layer 11 are layered sequentially on the first electrode 33 as shown in FIG. 5. The first metal layer 11 is required to be disposed above at least a portion of the surface 18a of the semiconductor layer 18. In particular, it is desirable that the first metal layer 11 is disposed at least in the vicinity of a recess (a "second recess 10D" described below) formed directly above the first recess 18D (directly above a "region R1" described later). The expression "in the vicinity of the recess formed directly above the first recess 18D" refers to being located in the vicinity of a "region R2" described below. The expression "the vicinity of the region R2" in the present embodiment may also be referred to as a "region R5" described below. In the step of bonding described below, when the first metal layer 11 is molten, the first metal layer 11 in the vicinity of the second recess 10D can be flowed into the second recess 10D to efficiently fill the second recess 10D. The first metal layer 11 is disposed above a portion of the surface 18a other than the first recess 18D as described above. The first metal layer 11 may also be disposed above the first recess 18D.

The fifth metal layer 15 and the first metal layer 11 are made of materials that interdiffuse to form an alloy when heated in contact with each other. The sixth metal layer 16 disposed between the fifth metal layer 15 and the first metal layer 11 impedes interdiffusion between the fifth metal layer 15 and the first metal layer 11. That is, while the fifth metal layer 15 is rapidly alloyed with the first metal layer 11 if the layers are heated in direct contact with each other, the sixth metal layer 16 delays the alloying between the fifth metal layer 15 and the first metal layer 11 by a certain period of time after heating. The fifth metal layer 15 is required to be alloyed with the first metal layer 11 afterward. Therefore, the material and thickness of the sixth metal layer 16 are appropriately selected or set in consideration of the size, depth, and the like of the recess formed in the surface of the semiconductor element structure 2 so that the alloying between fifth metal layer 15 and the first metal layer 11 is not impeded after the alloying of the layers is delayed by a certain period of time.

The first member 10 is provided as described above.

A surface 10a (the surface of the first metal layer 11) of the provided first member 10 defines the second recess 10D above the first recess 18D. For example, in a view seen through from above the upper surface of the first member 10, when a region in which the first recess 18D is located is referred to as the region R1 and a region in which the second recess 10D can be seen is referred to as the region R2, the region R1 is located inside the region R2. In other words, the first member 10 defines the second recess 10D at a surface of the first member 10 in the region R2 including the region directly above the first recess 18D.

Providing Second Member

Figure 6:
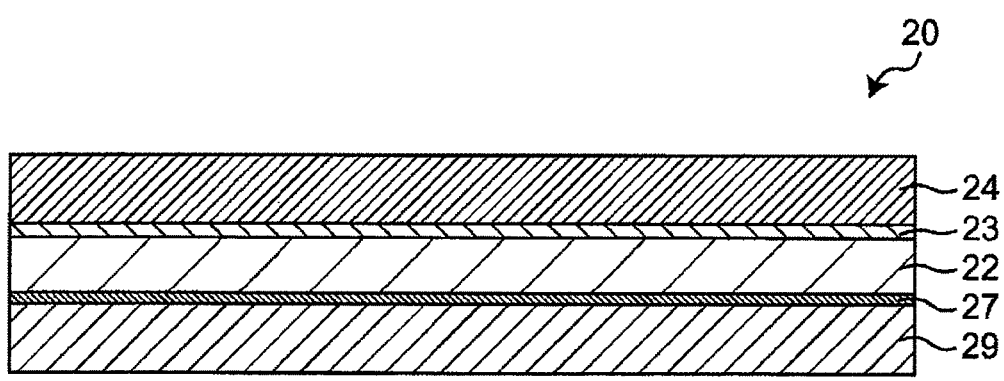
FIG. 6 is a schematic cross-sectional view for illustrating the manufacturing steps of the semiconductor device according to the first embodiment.

FIG. 6 is a schematic cross-sectional view for illustrating the step of providing a second member 20.

The second member 20 provided in the step of providing the second member 20 includes the supporting substrate (second substrate) 29, a second metal layer 22 disposed on the supporting substrate 29, a third metal layer 23 disposed on the second metal layer 22, and a fourth metal layer 24 disposed on the third metal layer 23 as shown in FIG. 6. The second member 20 may further include the seventh metal layer 27 between the supporting substrate 29 and the second metal layer 22. The seventh metal layer 27 is made of a material that can improve the adhesion between the supporting substrate 29 and the second metal layer 22. The seventh metal layer 27 may consist of only one layer (a single-layer film) of a metal such as Ti or Pt or an alloy of Ti, Pt, or the like. Alternatively, the seventh metal layer 27 may be a multilayer film including a plurality of metal layers described above and/or alloy layers.

In the step of providing the second member 20, the seventh metal layer 27 is formed over the supporting substrate 29 as needed, and the second metal layer 22, the third metal layer 23, and the fourth metal layer 24 are sequentially formed by sputtering or the like.

The second metal layer 22 and the fourth metal layer 24 are made of materials that interdiffuse to form an alloy when heated in contact with each other. The fourth metal layer 24 is preferably made of a metal material same as a material of the first metal layer 11, and the second metal layer 22 is preferably made of a metal material same as a material of the fifth metal layer 15. The third metal layer 23 impedes interdiffusion between the second metal layer 22 and the fourth metal layer 24 and delays the alloying of the second metal layer 22 with the fourth metal layer 24 by a certain period of time after heating. The second metal layer 22 is required to be alloyed with the fourth metal layer 24 afterwards. Therefore, the material and thickness of the third metal layer 23 are appropriately selected or set in consideration of the size, depth, and the like of the recess formed in the surface of the semiconductor element structure 2 so that the alloying is not impeded after the alloying of the layers is delayed by a certain period of time.

Bonding First Member 10 and Second Member 20 Together (Step of Bonding)

Figure 7:
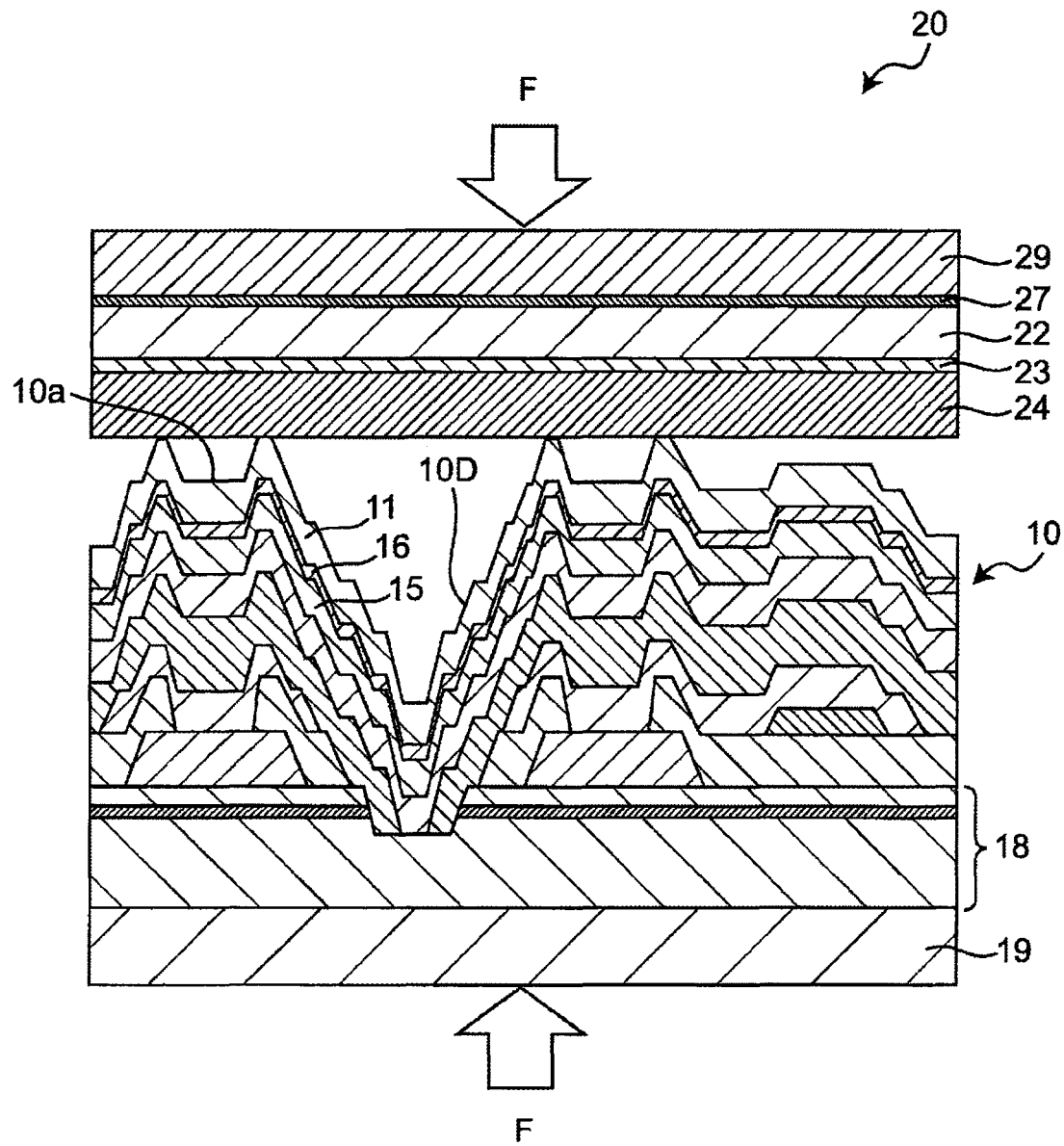
FIG. 7 is a schematic cross-sectional view for illustrating the manufacturing steps of the semiconductor device according to the first embodiment.

In the step of bonding, as shown in FIG. 7, the first metal layer 11 of the first member 10 and the fourth metal layer 24 of the second member 20 are brought into contact with each other to face each other, and are heated. The heating temperature at the time of bonding is set to, for example, a temperature higher than the melting point of the first metal layer 11 and the melting point of the fourth metal layer 24 and lower than the melting point of the third metal layer 23 and the melting point of the sixth metal layer 16.

In a first stage (early stage) of the bonding step, the third metal layer 23 and the sixth metal layer 16 impede diffusion of metal atoms of the second metal layer 22 into the fourth metal layer 24 and diffusion of metal atoms of the fifth metal layer into the first metal layer, respectively. This can reduce rise in the melting point due to alloying, which allows for maintaining the fluidity of the molten first and fourth metal layers 11 and 24, so that the molten first and fourth metal layers 11 and 24 can be easily flowed into the second recess 10D. Other recesses in the surface 10a of the first member 10 are also filled with the molten first and fourth metal layers 11 and 24. Accordingly, formation of gaps between the first member 10 and the second member 20 can be reduced.

In the bonding step, it is preferable to bond the first metal layer 11 and the fourth metal layer 24 together while pressing the first member 10 and the second member 20 in the directions of arrows F. This operation allows the molten first and fourth metal layers 11 and 24 to effectively flow into the second recess 10D, so that the second recess 10D can be filled in a comparatively short time.

In a second stage of the bonding step, a portion or whole of the third metal layer 23 and the sixth metal layer 16 is deformed due to melting of the first metal layer 11 and the fourth metal layer 24, so that the effect of the third metal layer 23 and the sixth metal layer 16 to impede diffusion is reduced. Examples of the deformation of the third metal layer 23 and the sixth metal layer 16 include formation of holes in the third metal layer 23 and the sixth metal layer 16 and diffusion of the third metal layer 23 and the sixth metal layer 16 into other metal layers. Accordingly, the metal of the fifth metal layer 15 of the first member 10 and the metal of the second metal layer 22 of the second member 20 are diffused into and are alloyed with the first metal layer 11 and the fourth metal layer 24 that are molten and bonded together. The first metal layer 11, the fourth metal layer 24, the fifth metal layer 15, and the second metal layer 22 are thus alloyed and integrated to form the single alloy bonding layer 60 (see FIG. 8).

In this manner, the possibility that gaps will be left can be reduced, and the alloy bonding layer 60, which is formed by alloying and having a melting point higher than that of the first metal layer 11 and the fourth metal layer 24, more firmly bonds the supporting substrate and the semiconductor element structure than in the case in which the sixth metal layer 16 and the third metal layer 23 are not disposed.

The heating temperature in the bonding step is preferably set in a range of 260° C. to 300° C. Setting the heating temperature in this range allows for reducing influence of heat on other members (such as the semiconductor layer 18).

Preferable Materials and Configurations of First to Sixth Metal Layers

As described above, the first to sixth metal layers exhibit different functions in the bonding. Materials and configurations of each of the first to sixth metal layers in consideration of respective functions will be described below.

1. Third Metal Layer 23 and Sixth Metal Layer 16

As described above, the third metal layer 23 and the sixth metal layer 16 have a function of impeding alloying in the first stage of the bonding step while not impeding alloying in the second stage.

In order to effectively exhibit such function of the third and sixth metal layers 23 and 16, the metal constituting the third metal layer 23 preferably has a diffusion coefficient in the second metal layer 22 smaller than a diffusion coefficient of the metal constituting the fourth metal layer 24 in the second metal layer 22. This constitution allows for further delaying the arrival of the metal constituting the fourth metal layer 24 at the second metal layer 22, so that alloying in the early stage can be effectively impeded.

The metal constituting the third metal layer 23 preferably has a diffusion coefficient in the fourth metal layer 24 smaller than a diffusion coefficient of the metal constituting the second metal layer 22, in the fourth metal layer 24. This constitution allows for further delaying the arrival of the metal constituting the second metal layer 22 at the fourth metal layer 24, so that alloying in the early stage can be effectively impeded.

Similarly, the metal constituting the sixth metal layer 16 have a diffusion coefficient in the fifth metal layer 15 is preferably smaller than a diffusion coefficient of the metal constituting the first metal layer 11 in the fifth metal layer 15.

This constitution allows for further delaying the arrival of the metal constituting the first metal layer 11 at the fifth metal layer 15, so that alloying in the early stage can be effectively impeded.

The metal constituting the sixth metal layer 16 preferably has a diffusion coefficient in the first metal layer 11 smaller than a diffusion coefficient of the metal constituting the fifth metal layer 15 in the first metal layer 11.

This constitution allows for further delaying the arrival of the metal constituting the fifth metal layer 15 at the first metal layer 11, so that alloying in the early stage can be effectively impeded.

In order to effectively exhibit function of the third metal layer 23 and the sixth metal layer 16, in addition to appropriately selecting types of the metals, the third metal layer 23 and the sixth metal layer 16 can have thicknesses and configurations described below.

Each of the sixth metal layer 16 and the third metal layer 23 has a thickness selected in consideration of the size and shape of the second recess 10D and the thicknesses of the first metal layer 11 and the fourth metal layer 24, such that the fluidity of the first metal layer 11 and the fourth metal layer 24 is prevented from being deteriorated to allow the first metal layer 11 and the fourth metal layer 24 to be filled into the second recess 10D in the first stage and such that alloying is not interfered with after the second stage.

More specifically, each of the sixth metal layer 16 and the third metal layer 23 has a thickness in a range of, for example, 1 nm to 100 nm. For example, in the case in which the first metal layer 11 and the fourth metal layer 24 has a great thickness, a thickness of each of the sixth metal layer 16 and the third metal layer 23 is increased within the range described above so that the first metal layer 11 and the fourth metal layer 24 are filled into the second recess 10D and alloyed in the second stage.

Also, with the third metal layer 23 and the sixth metal layer 16 each having a thickness smaller than a thickness of other metal layers, the effect of impeding diffusion between the fifth metal layer 15 and the second metal layer 22 can be eliminated or reduced while impeding alloying in the first stage.

More specifically, the third metal layer has a thickness smaller than a thickness of each of the first, second, and fourth metal layers. In addition, the sixth metal layer has a thickness smaller than a thickness of each of the first, fifth, and fourth metal layers. With this structure, the effect of impeding alloying of the fifth metal layer 15 and the second metal layer 22 can be eliminated or reduced after the first stage.

Further, the third metal layer 23 and the sixth metal layer 16 can be formed of porous metal films or can have configurations such as an island shape, a stripe shape, or a perforated shape having a plurality of holes (formation of such configurations may be referred to as "patterning"). Such a configuration allows for forming a more uniform alloy bonding layer 60 while exhibiting the effect of impeding alloying between the first metal layer 11 and the fifth metal layer 15 and the effect of impeding alloying between the fourth metal layer 24 and the second metal layer 22 to some degree.

For example, when the third metal layer 23 and the sixth metal layer 16 are patterned to have an island, stripe, or perforated shape, in portions without the third metal layer 23 or the sixth metal layer 16, the first metal layer 11 is in contact with the fifth metal layer 15, and the second metal layer 22 is in contact with the fourth metal layer 24.

In this configuration, the third metal layer 23 is disposed over a portion of the surface of the second metal layer 22, and the fourth metal layer 24 is disposed over the third metal layer 23 and a portion of the second metal layer 22 that is exposed from the third metal layer 23.

Similarly, the sixth metal layer 16 is disposed over a portion of the surface of the fifth metal layer 15, and the first metal layer 11 is disposed over the sixth metal layer 16 and a portion of the fifth metal layer 15 that is exposed from the sixth metal layer 16.

Alloying is not impeded in the portions where the first metal layer 11 is in direct contact with the fifth metal layer 15 and in the portions where the fourth metal layer 24 is in direct contact with the second metal layer 22. With this structure, the effect of the sixth metal layer 16 to impede alloying between the first metal layer 11 and the fifth metal layer 15 and the effect of the third metal layer 23 to impede alloying between the fourth metal layer 24 and the second metal layer 22 can be reduced. Accordingly, alloying between the first metal layer 11 and the fifth metal layer 15 and alloying between the fourth metal layer 24 and the second metal layer 22 start earlier than in the case in which the third metal layer 23 and the sixth metal layer 16 are not patterned (in other words, in the case in which each of the third metal layer 23 and the sixth metal layer 16 is formed as a continuous metal layer). Accordingly, alloying between the first metal layer 11 and the fifth metal layer 15 and alloying between the fourth metal layer 24 and the second metal layer 22 inside the second recess 10D are promoted. As a result, the state of alloying of the alloy bonding layer 60 inside the third recess 33D becomes more uniform in the finished semiconductor device 1, and the bonding strength between the semiconductor element structure 2 and the supporting substrate 29 is further enhanced.

The fluidity of the first metal layer 11 and the fourth metal layer 24 in the molten state tends to decrease as the alloying progresses. If the alloying occurs earlier, decrease in the fluidity of the first metal layer 11 and the fourth metal layer 24 starts in a comparatively early stage of the bonding step, and the second recess 10D may not be sufficiently filled. Accordingly, the shape of patterning and the like is appropriately designed to control the timing and progress of alloying of the first metal layer 11 with the fourth metal layer 24 so that a gap is not left in the second recess 10D. An appropriate timing of starting alloying and appropriate progress of the alloying are deemed to vary according to the shape, dimensions, and the like of the second recess 10D.

Adjusting the configurations (the thicknesses of the metal films and the shapes of patterning) of the third metal layer 23 and the sixth metal layer 16 with consideration of the ease of alloying between the first metal layer 11 and the fourth metal layer 24, the capacity of the second recess 10D, and the like allows for controlling the fluidity of the first metal layer 11 and the fourth metal layer 24 in the early stage (first stage) in the bonding step and the state of progress of alloying in the second stage, so that leaving of a gap can be reduced while the alloying state of the alloy bonding layer 60 can be highly uniform.

In the case in which the third metal layer 23 is formed over a portion of the surface of the second metal layer 22, the third metal layer 23 is preferably formed where the second recess 10D is located in a top view when the first metal layer 11 is brought into contact with the fourth metal layer 24 such that the first metal layer 11 and the fourth metal layer 24 face each other.

This structure can impede alloying in the region directly above the region in which the second recess 10D is formed, and promote alloying between the first metal layer 11 and the fourth metal layer 24 in the region other than the region directly above the second recess 10D without reducing flow of the first metal layer 11 and the fourth metal layer 24 into the second recess 10D.

Similarly, in the case in which the sixth metal layer 16 is formed over a portion of the surface of the fifth metal layer 15, the sixth metal layer 16 is preferably formed where the second recess is located in a top view when the first metal layer 11 is brought into contact with the fourth metal layer 24 such that the layers face each other.

This structure can also impede alloying in the region directly above the region in which the second recess 10D is formed and promotes alloying in the region other than the region directly above the second recess 10D without reducing flow of the first metal layer 11 and the fourth metal layer 24 into the second recess 10D.

In the case in which the third metal layer is patterned, the smaller the area of the portion of the second metal layer 22 exposed from the third metal layer 23 is, the smaller the area of contact between the second metal layer 22 and the fourth metal layer 24 becomes. Alloying of the second metal layer 22 with the fourth metal layer 24 can thus be delayed.

Similarly, in the case in which the sixth metal layer is patterned, the smaller the area of the fifth metal layer 15 exposed from the sixth metal layer 16 is, the smaller the area of contact between the first metal layer 11 and the fifth metal layer 15 becomes. Alloying of the first metal layer 11 with the fifth metal layer 15 can thus be delayed. As described above, adjusting the area of the second metal layer 22 exposed from the third metal layer 23 and/or the area of the fifth metal layer 15 exposed from the sixth metal layer 16 allows for controlling the progress of alloying.

The third metal layer 23 and the sixth metal layer 16 preferably contain Ti, Cr, or Al, which have a relatively high melting point such that the metal is not easily melt by heating in the bonding step and is likely to form an oxide. An oxide of such a metal is unlikely to diffuse into metal layers (particularly the first metal layer 11 and the fourth metal layer 24) even when formed into a thin layer, and therefore has the effect of impeding alloying between the fifth metal layer 15 and the first metal layer 11 and alloying between the fourth metal layer 24 and the second metal layer 22 in the first stage of the bonding step.

2. Metal Layers Other than Third Metal Layer 23 and Sixth Metal Layer 16

Each of the first metal layer 11 and the fourth metal layer 24 has a thickness in the range of, for example, 0.5 µm to 10 µm. In the case in which the second recess 10D has a great depth, for example, the first metal layer 11 and the fourth metal layer 24 has a great thickness within the range described above. Increase of a thickness of each of the first metal layer 11 and the fourth metal layer 24 allows for sufficiently filling the second recess 10D even in the case in which the second recess 10D is has a great depth, and formation of a gap in the alloy bonding layer 60 can be effectively reduced. On the other hand, if each of the first metal layer 11 and the fourth metal layer 24 has an excessively great thickness, distortion caused by bonding is increased, and accordingly, for example, the semiconductor layer 18 may be warped. Accordingly, the thickness of each of the first metal layer 11 and the fourth metal layer 24 is preferably 10 µm or less.

The thickness of each of the fifth metal layer 15 and the second metal layer 22 is, for example, in a range of 100 nm to 10 µm.

Each of the metal material constituting the first metal layer 11 and the metal material constituting the fourth metal layer 24 preferably has a melting point lower than a melting point of each of the metal material constituting the fifth metal layer 15 and the metal material constituting the second metal layer 22. With this constitution, the first metal layer 11 and the fourth metal layer 24 melt first and start to fill the second recess 10D, and then the fifth metal layer 15 and the second metal layer 22 melt to be alloyed with the first metal layer 11 and the fourth metal layer 24.

The alloy material (the material constituting the alloy bonding layer 60) after the first metal layer 11 and the fourth metal layer 24 are alloyed with the fifth metal layer 15 and the second metal layer 22 preferably has a melting point higher than the melting point of the metal material constituting the first metal layer 11 and the melting point of the metal material constituting the fourth metal layer 24. This constitution allows for preventing the alloy bonding layer 60 from melting even at a temperature at which the first metal layer 11 and the fourth metal layer 24 melt.

Examples of metal materials preferable for the first metal layer 11 and the fourth metal layer 24 include Sn, Pb, AuSn, and In. The first metal layer 11 and the fourth metal layer 24 can be made of different metal materials but are preferably made of the same metal material.

Examples of metal materials preferable for the fifth metal layer 15 and the second metal layer 22 include Ni, Pt, and Au. The fifth metal layer 15 and the second metal layer 22 may be made of the same metal material or different metal materials.

The materials of the first metal layer 11 and the fourth metal layer 24 can be selected from among the metal materials that are described above as materials preferably used, the material of the fifth metal layer 15 and the material of the second metal layer 22 can be selected from among the metal materials that are described above as materials preferably used, and the heating temperature in the bonding step can be in the range of 260° C. to 300° C. With this temperature range, the first metal layer 11 and the fourth metal layer 24 can sufficiently flow into the second recess, and the influence of heat on other members (such as the semiconductor layer 18) in the semiconductor device 1 can be reduced.

As described above, the method of manufacturing according to the first embodiment can impede formation of a gap at the bonded portion even in the case in which a semiconductor layer that defines a recess in a surface of the semiconductor layer is transferred to the supporting substrate.

Figure 10:
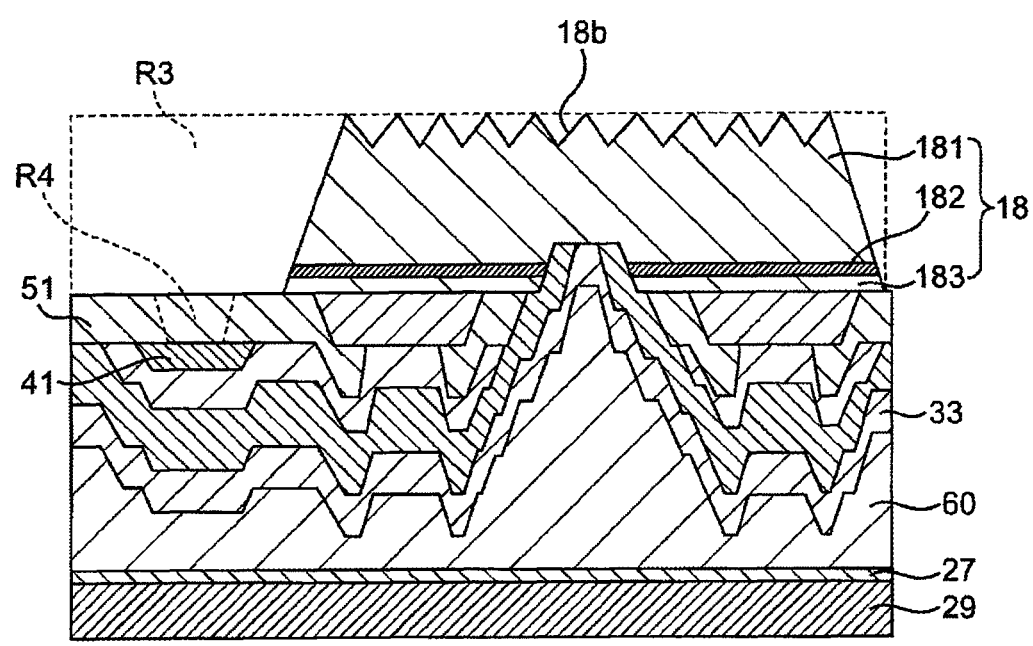
FIG. 10 is a schematic cross-sectional view for illustrating the manufacturing steps of the semiconductor device according to the first embodiment.

After the step of bonding the first member 10 and the second member 20, removing of a portion of the semiconductor layer 18 is performed such that a portion R3 of the semiconductor layer 18 is removed to expose the first protective film 51, and a portion R4 of the first protective film 51 is removed to expose the first wiring 41, as shown in FIG. 10. Removal of the portion R3 of the semiconductor layer 18 and the portion R4 of the first protective film 51 can be performed by reactive ion etching (RIE) or the like. Etching of the first protective film 51 stops when the first wiring 41 is exposed from the first protective film. The first wiring 41 therefore also functions as an etching stop layer.

In the case in which the semiconductor device 1 is a semiconductor light-emitting device, roughening of a lower surface 18b of the semiconductor layer 18 may be performed after the step of bonding the first member 10 and the second member 20. Roughening of the lower surface 18b of the semiconductor layer 18 can be performed by wet etching or the like. In addition, a light-transmissive protective film 53 may be formed over the entirety of an exposed surface of the semiconductor layer 18 and the exposed surface of the first protective film 51.

In the semiconductor device of the first embodiment and the method of manufacturing the same described above, an example according to the third mode is described, in which the third metal layer for impeding alloying between the fourth metal layer and the second metal layer is disposed between the fourth metal layer at the bonding surface side of the supporting substrate and the second metal layer, and in which the sixth metal layer for impeding alloying between the first metal layer and the fifth metal layer is disposed between the first metal layer at the bonding surface side of the semiconductor element and the fifth metal layer.

Figure 8:
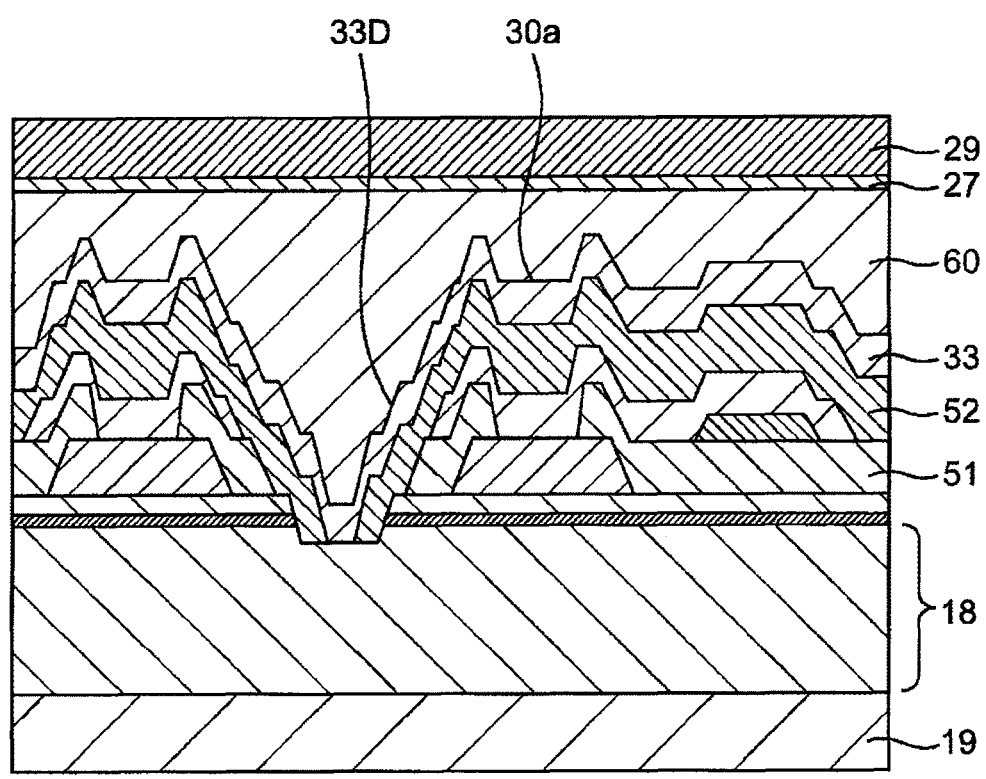
FIG. 8 is a schematic cross-sectional view for illustrating the manufacturing steps of the semiconductor device according to the first embodiment.
Figure 11A:
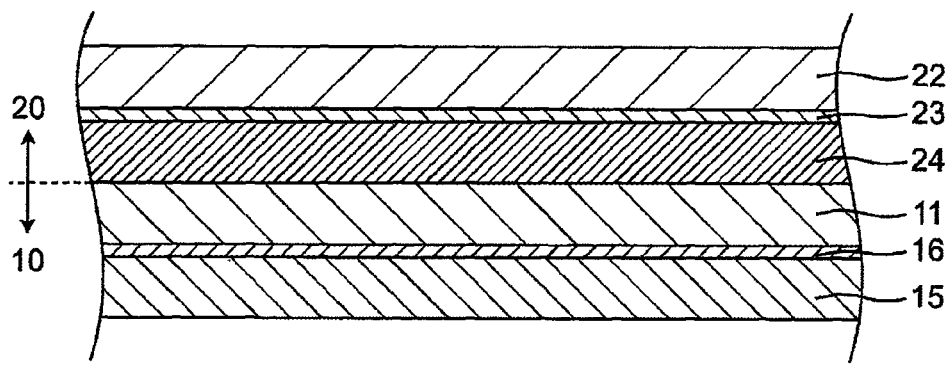
FIG. 11A to FIG. 11C are schematic cross-sectional views of various modes of layering of metal layers that can constitute an alloy bonding layer.

That is, in the first embodiment, as for the three metal layers (the fifth metal layer 15, the sixth metal layer 16, and the first metal layer 11) disposed in the first member 10 and the three metal layers (the fourth metal layer 24, the third metal layer 23, and the second metal layer 22) disposed in the second member 20 schematically shown in FIG. 11A, the first metal layer 11 and the fourth metal layer 24 are melt-bonded together in the first stage of the bonding step, and the sixth metal layer 16 and the third metal layer 23 are partially or wholly deformed in the second stage to allow the fifth metal layer 15 and the second metal layer 22 to diffuse into the melt of the first metal layer 11 and the fourth metal layer 24, so that the alloy bonding layer 60 is formed (FIG. 8).

In other words, with the constitution of the metal films as shown in FIG. 11A, the first metal layer 11 and the fourth metal layer 24 can have high fluidity to sufficiently fill the second recess 10D in the first stage, and the first metal layer 11 and the fourth metal layer 24 can be alloyed together to form the alloy bonding layer 60 in the second stage.

The present disclosure is not limited to the semiconductor device of the first embodiment and the method of manufacturing the same. The three metal layers may be disposed in the first member 10 and/or the second member 20 and bonded together to form the alloy bonding layer 60 while promoting filling of the second recess.

Figure 11B:
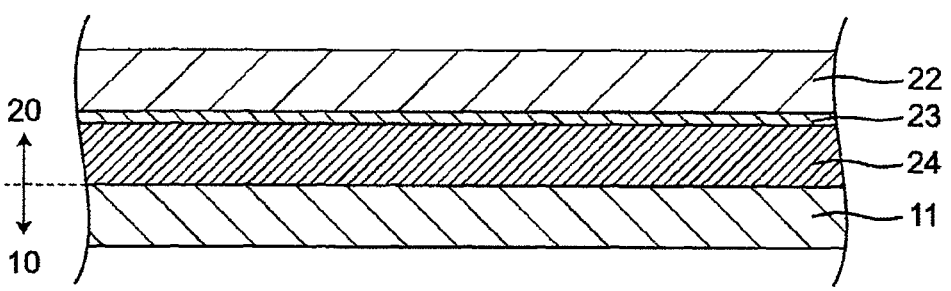

In an example according to the first mode shown in FIG. 11B, the first member 10 includes the first metal layer 11, and the second member 20 includes three metal layers, that is, the fourth metal layer 24, the third metal layer 23, and the second metal layer 22. When having such a layered structure, the first metal layer 11 and the fourth metal layer 24 are melt-bonded together in the first stage of the bonding step, and the third metal layer 23 is partially or wholly deformed in the second stage to allow the second metal layer 22 to diffuse into the melt of the first metal layer 11 and the fourth metal layer 24, so that the alloy bonding layer 60 is formed.

In other words, also with the constitution of the metal films as shown in FIG. 11B, the first metal layer 11 and the fourth metal layer 24 can have high fluidity to sufficiently fill the second recess 10D in the first stage, and the first metal layer 11 and the fourth metal layer 24 can be alloyed to form the alloy bonding layer 60 in the second stage.

When having a layered structure shown in FIG. 11B, the thickness of the third metal layer 23 is preferably smaller than each of a thickness of the first metal layer 11, a thickness of the second metal layer 22, and a thickness of the fourth metal layer 24.

The melting point of the first metal layer 11 and the melting point of the fourth metal layer 24 are preferably lower than the melting point of the second metal layer 22, and the melting point of the alloy bonding layer after the first metal layer 11, the fourth metal layer 24, and the second metal layer 22 are alloyed is preferably higher than the melting point of the first metal layer 11 and the melting point of the fourth metal layer 24.

Figure 11C:
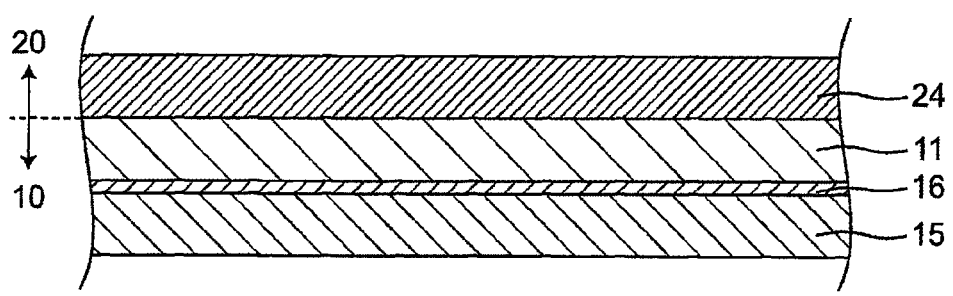

In an example according to the second mode shown in FIG. 11C, the first member 10 includes three metal layers, that is, the fifth metal layer 15, the sixth metal layer 16, and the first metal layer 11, and the second member 20 includes the fourth metal layer 24. When having such a layered structure, the first metal layer 11 and the fourth metal layer 24 are melt-bonded together in the first stage of the bonding step, and the sixth metal layer 16 is partially or wholly deformed in the second stage to allow the fifth metal layer 15 to diffuse into the melt of the first metal layer 11 and the fourth metal layer 24, so that the alloy bonding layer 60 is formed.

In other words, with the constitution of the metal films as shown in FIG. 11C, the first metal layer 11 and the fourth metal layer 24 can have high fluidity to sufficiently fill the second recess 10D in the first stage, and the first metal layer 11 and the fourth metal layer 24 can be alloyed together to form the alloy bonding layer 60 in the second stage.

In the case of the constitution of layers shown in FIG. 11C, the thickness of the sixth metal layer 16 is preferably smaller than each of the thickness of the first metal layer 11, the thickness of the fifth metal layer 15, and the thickness of the fourth metal layer 24.

The melting point of the first metal layer 11 and the melting point of the fourth metal layer 24 are preferably lower than the melting point of the fifth metal layer 15, and the melting point of the alloy bonding layer after alloying the first metal layer 11, the fourth metal layer 24, and the fifth metal layer 15 together is preferably higher than the melting point of the first metal layer 11 and the melting point of the fourth metal layer 24.

The dashed lines extending on the left side in FIG. 11A to FIG. 11C indicate the boundary between the first member 10 and the second member 20. One or more metal layers above (in a direction indicated by the upward arrow) the boundary (indicated by dashed line) between the first member 10 and the second member 20 are included in the second member 20. One or more metal layers below (in a direction indicated by the downward arrow) the boundary (indicated by dashed line) between the first member 10 and the second member 20 are included in the first member 10.

Second Embodiment

A second embodiment differs from the first embodiment in the constitutions of a first member 100 and a second member 200 used in the manufacturing steps.

Figure 12A:
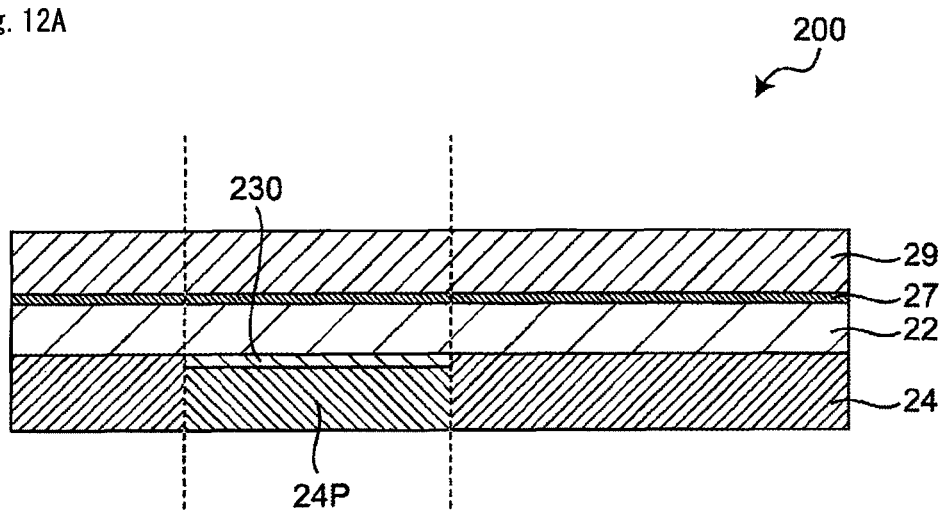
FIG. 12A is a schematic cross-sectional view of the constitution of a second member used for a semiconductor device of a second embodiment.
Figure 12B:
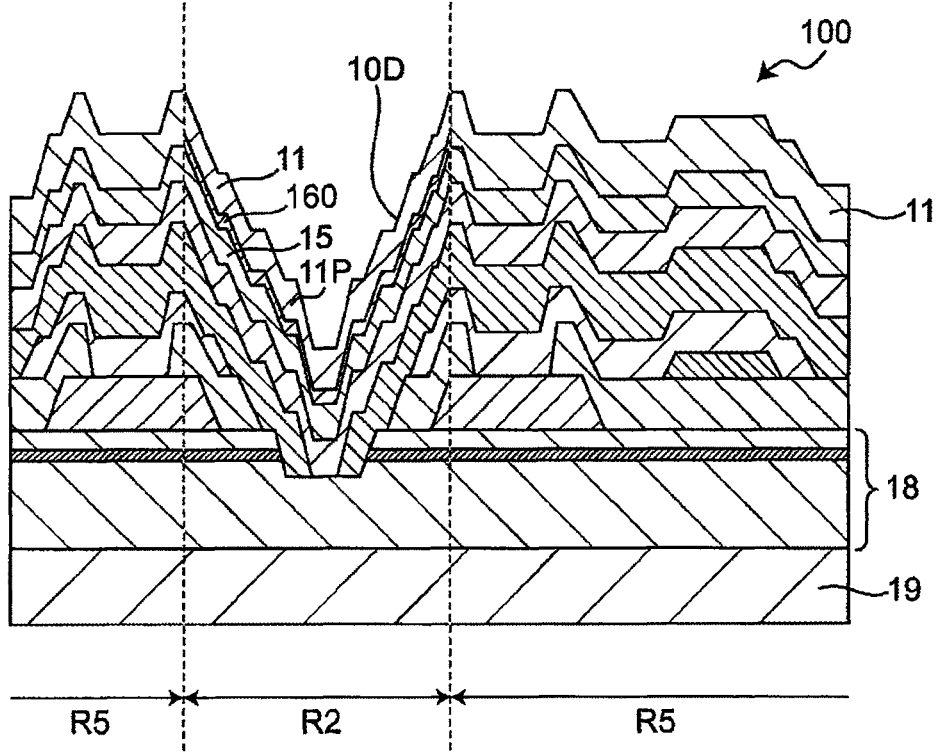
FIG. 12B is a schematic cross-sectional view of the constitution of a first member used for the semiconductor device of the second embodiment.

FIG. 12A shows the constitution of the second member 200 used in the second embodiment, and FIG. 12B shows the constitution of the first member 100 used in the second embodiment.

The second member 200 shown in FIG. 12A differs from the second member 20 shown in FIG. 7 in a region in which a third metal layer 230 is formed. More specifically, the third metal layer 230 is disposed over a portion of the surface of the second metal layer 22, and the fourth metal layer 24 is disposed over the second metal layer 22 and the third metal layer 230. More specifically, the third metal layer 230 disposed over a portion of the surface of the second metal layer 22 is disposed where the second recess 10D is located (in other words, in the region R2) in a top view when the first metal layer 11 is brought into contact with the fourth metal layer 24 such that the layers face each other. In FIG. 12A, the third metal layer 230 is not disposed outside (in the region R5) the position (the region R2) where the second recess 10D is located. The third metal layer 230 may be expanded from the region R2 into a portion of the region R5 adjacent to the region R2.

The first member 100 shown in FIG. 12B differs from the first member 10 shown in FIG. 7 in a region in which a sixth metal layer 160 is formed. The sixth metal layer 160 is disposed over a portion of the surface of the fifth metal layer 15, and the first metal layer 11 is disposed over the fifth metal layer 15 and the sixth metal layer 160. More specifically, the sixth metal layer 160 disposed over a portion of the surface of the fifth metal layer 15 is disposed where the second recess 10D is located (in other words, in the region R2) in a top view when the first metal layer 11 is brought into contact with the fourth metal layer 24 such that the first metal layer 11 and the fourth metal layer 24 face each other. In FIG. 12B, the sixth metal layer 160 is not disposed outside (in the region R5) the position (the region R2) where the second recess 10D is located. The sixth metal layer 160 may be expanded from the region R2 into a portion of the region R5 adjacent to the region R2.

In the second embodiment, the first metal layer 11 and the fourth metal layer 24 are first molten in the step of bonding the first member 100 and the second member 200. At this time, a portion 11P of the first metal layer 11 and a portion 24P of the fourth metal layer 24 inside the region (the region R2 in FIG. 12A and FIG. 12B) in which the third metal layer 230 and the sixth metal layer 160 are formed are not in direct contact with the fifth metal layer 15 and the second metal layer 22, respectively. With this structure, alloying is impeded in the first stage of the bonding step. Accordingly, in a molted state, a relatively high fluidity of the portion 11P of the first metal layer 11 and the portion 24P of the fourth metal layer 24 is maintained to fill the second recess 10D.

In the region (the region R5 in FIG. 12A and FIG. 12B) in which the third metal layer 230 and the sixth metal layer 160 are not formed, the first metal layer 11 and the fourth metal layer 24 are respectively in direct contact with the fifth metal layer 15 and the second metal layer 22, and alloying of the first metal layer 11 and the fourth metal layer 24 therefore progresses even in the first stage of the bonding step. On the other hand, the portion 11P of the first metal layer 11 and the portion 24P of the fourth metal layer 24 can fill the second recess 10D.

With the portion 11P of the first metal layer 11 and the portion 24P of the fourth metal layer 24 not in direct contact with the fifth metal layer 15 and the second metal layer 22, respectively, a relatively high fluidity is maintained. However, the metal constituting the fifth metal layer 15 or the second metal layer 22 can slightly diffuse into the portion 11P or the portion 24P from their vicinities. In other words, the portion 11P and the portion 24P are gradually alloyed while filling the second recess 10D. Accordingly, the state of alloying of the alloy bonding layer 60 inside the third recess 33D becomes more uniform, and the bonding strength between the semiconductor element structure 2 and the supporting substrate 29 can be further enhanced.

Similarly to the manufacturing method according to the first embodiment, the method of manufacturing according to the second embodiment described above can also impede formation of a gap at the bonded portion in the case in which the semiconductor layer defining the recess in a surface of the semiconductor layer is transferred to the supporting substrate.

The method of manufacturing according to the first embodiment and the method of manufacturing according to the second embodiment described above may include the step of removing the growth substrate 19 as described below.

Figure 9:
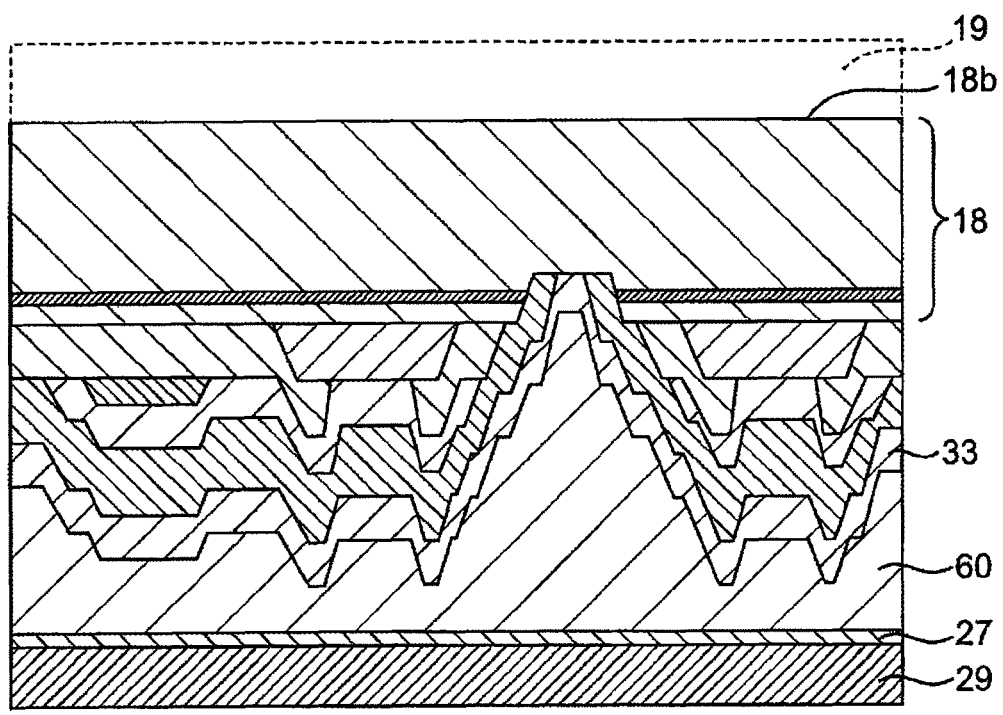
FIG. 9 is a schematic cross-sectional view for illustrating the manufacturing steps of the semiconductor device according to the first embodiment.

In the step of removing the growth substrate 19, for example, the growth substrate 19 is removed from the lower surface 18b of the semiconductor layer 18 after the bonding step as shown in FIG. 9. In this removing step, for example, laser light is irradiated from a growth substrate 19 side using laser lift off to decompose the interface between the upper surface 19a of the growth substrate 19 and the lower surface 18b of the semiconductor layer 18, so that the growth substrate 19 is removed.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A method of manufacturing a semiconductor device, the method comprising:
   providing a first member comprising:
      a first substrate,
      a semiconductor layer disposed on the first substrate and defining a first recess in a surface of the semiconductor layer, and
      a first metal layer disposed above at least a portion of the surface of the semiconductor layer other than the first recess,
      the first member defining a second recess in a region of a surface of the first member including a region directly above the first recess;
   providing a second member comprising:
      a second substrate,
      a second metal layer on or above the second substrate,
      a third metal layer on the second metal layer, and
      a fourth metal layer on the third metal layer; and
   bonding the first member and the second member together by heating the first metal layer and the fourth metal layer while facing each other, to allow the first and fourth metal layers to be interdiffused with the second metal layer and to be alloyed,
   wherein the third metal layer impedes interdiffusion between the second metal layer and the fourth metal layer.

2. The method of manufacturing a semiconductor device according to claim 1, wherein a diffusion coefficient of a metal constituting the third metal layer in the second metal layer is smaller than a diffusion coefficient of a metal constituting the fourth metal layer in the second metal layer.

3. The method of manufacturing a semiconductor device according to claim 2, wherein a diffusion coefficient of a metal constituting the third metal layer in the fourth metal layer is smaller than a diffusion coefficient of a metal constituting the second metal layer in the fourth metal layer.

4. The method of manufacturing a semiconductor device according to claim 1,
   wherein the third metal layer is disposed on a portion of a surface of the second metal layer, and
   wherein the fourth metal layer is disposed over the second metal layer and the third metal layer.

5. The method of manufacturing a semiconductor device according to claim 4, wherein the third metal layer over the portion of the surface of the second metal layer is disposed where the second recess is located in a top view when the first metal layer is brought into contact with the fourth metal layer such that the first metal layer and the fourth metal layer face each other.

6. The method of manufacturing a semiconductor device according to claim 1, wherein a thickness of the third metal layer is smaller than a thickness of the first metal layer, a thickness of the second metal layer, and a thickness of the fourth metal layer.

7. The method of manufacturing a semiconductor device according to any one of claim 1, wherein the third metal layer contains Ti, Cr, or Al.

8. The method of manufacturing a semiconductor device according to claim 1,
   wherein a melting point of the first metal layer and a melting point of the fourth metal layer are lower than a melting point of the second metal layer, and
   wherein a melting point of a portion in which the first and fourth metal layers are alloyed with the second metal layer in the bonding step is higher than the melting point of the first metal layer and the melting point of the fourth metal layer.

9. The method of manufacturing a semiconductor device according to claim 1,
   wherein the first member further comprises:
      a fifth metal layer above the semiconductor layer; and
      a sixth metal layer disposed on the fifth metal layer and between the first metal layer and the fifth metal layer to impede interdiffusion of the fifth metal layer and the first and fourth metal layers, and
   wherein, in the bonding step, the first metal layer and the fourth metal layer are alloyed with the fifth metal layer by interdiffusion.

10. The method of manufacturing a semiconductor device according to claim 9, wherein a diffusion coefficient of a metal constituting the sixth metal layer in the fifth metal layer is smaller than a diffusion coefficient of a metal constituting the first metal layer in the fifth metal layer.

11. The method of manufacturing a semiconductor device according to claim 10, wherein a diffusion coefficient of a metal constituting the sixth metal layer in the first metal layer is smaller than a diffusion coefficient of a metal constituting the fifth metal layer in the first metal layer.

12. The method of manufacturing a semiconductor device according to claim 1, wherein, in the bonding step, the first member and the second member are pressed to bond the first metal layer and the fourth metal layer together.

13. The method of manufacturing a semiconductor device according to claim 1, wherein, in the bonding step, the heating is performed at a temperature in a range of 260° C. to 300° C.

14. A method of manufacturing a semiconductor device, the method comprising:
   providing a first member comprising:
      a first substrate,
      a semiconductor layer disposed on the first substrate and defining a first recess in a surface of the semiconductor layer,
      a fifth metal layer on or above the semiconductor layer,
      a sixth metal layer on the fifth metal layer, and
      a first metal layer on or above at least a portion of a surface of the sixth metal layer other than the first recess,
      the first member defining a second recess in a region of a surface of the first member including a region directly above the first recess;
   providing a second member comprising:
      a second substrate, and
      a fourth metal layer on or above the second substrate; and
   bonding the first member and the second member together by heating the first metal layer and the fourth metal layer while facing each other, to allow the first and fourth metal layers to be interdiffused with the fifth metal layer and to be alloyed,
   wherein the sixth metal layer impedes interdiffusion between the fifth metal layer and the first and fourth metal layers.

15. The method of manufacturing a semiconductor device according to claim 14,
   wherein the sixth metal layer is disposed over a portion of a surface of the fifth metal layer, and
   wherein the first metal layer is disposed over the fifth metal layer and the sixth metal layer.

16. The method of manufacturing a semiconductor device according to claim 15, wherein the sixth metal layer over the portion of the surface of the fifth metal layer is disposed where the second recess is located in a top view when the first metal layer is brought into contact with the fourth metal layer such that the first metal layer and the fourth metal layer face each other.

17. The method of manufacturing a semiconductor device according to claim 14, wherein a thickness of the sixth metal layer is smaller than a thickness of the first metal layer, a thickness of the fifth metal layer, and a thickness of the fourth metal layer.

18. The method of manufacturing a semiconductor device according to claim 14, wherein the sixth metal layer contains Ti, Cr, or Al.

19. The method of manufacturing a semiconductor device according to claim 14,
   wherein a melting point of the first metal layer and a melting point of the fourth metal layer are lower than a melting point of the fifth metal layer, and
   wherein a melting point of a portion in which the first and fourth metal layers are alloyed with the fifth metal layer in the bonding step is higher than the melting point of the first metal layer and the melting point of the fourth metal layer.

* * * * *